United States Patent [19]
Hopkins et al.

[11] Patent Number: 5,625,617
[45] Date of Patent: Apr. 29, 1997

[54] NEAR-FIELD OPTICAL APPARATUS WITH A LASER HAVING A NON-UNIFORM EMISSION FACE

[75] Inventors: Leslie C. Hopkins, Flemington; Cherry A. Murray, Murray Hill, both of N.J.; Afshin Partovi, New York, N.Y.; David R. Peale; Hsi-jen J. Yeh, both of Chatham, N.J.; George J. Zydzik, Columbia, N.J.

[73] Assignee: Lucent Technologies Inc., Murray Hill, N.J.

[21] Appl. No.: 523,884

[22] Filed: Sep. 6, 1995

[51] Int. Cl.$^6$ .................................................. G11B 7/00
[52] U.S. Cl. .................... 369/121; 369/122; 369/44.12; 369/126; 250/306; 250/216; 372/43
[58] Field of Search .................... 250/227.26, 306, 250/307, 216; 372/46, 45, 92, 99, 44, 43, 49, 50; 369/44.12, 121, 126, 122; 324/96, 117 R, 244.1; 427/553, 595

[56] References Cited

U.S. PATENT DOCUMENTS

| | | | |
|---|---|---|---|
| 4,449,204 | 5/1984 | Shimada et al. | 365/127 |
| 4,460,977 | 7/1984 | Shimada et al. | 365/106 |
| 4,860,276 | 8/1989 | Ukita et al. | 369/119 |
| 5,115,441 | 5/1992 | Kopf et al. | 372/45 |
| 5,288,998 | 2/1994 | Betzig et al. | 250/227.26 |
| 5,294,790 | 3/1994 | Ohta et al. | 250/216 |
| 5,406,194 | 4/1995 | Dykaar et al. | 324/96 |
| 5,448,581 | 9/1995 | Wu et al. | 372/45 |
| 5,461,600 | 10/1995 | Pohl | 369/44.12 |
| 5,493,577 | 2/1996 | Choquette et al. | 372/46 |
| 5,509,300 | 4/1996 | Chamberlin et al. | 250/306 |
| 5,511,089 | 4/1996 | Yamada | 372/49 |
| 5,539,197 | 7/1996 | Courjon et al. | 250/216 |

OTHER PUBLICATIONS

"Optical Stethoscopy: Image Recording With Resolution $\lambda/20$", by D. W. Pohl et al., *Applied Physics Letters*, vol. 44(7), 1 Apr. 1984, pp. 651–653.

"Near-field Optical-scanning Microscopy", by U. Durig et al., *Journal of Applied Physics*, vol. 59(10), 15 May 1986, pp. 3318–3327.

"Near-field Magneto-optics and High Density Data Storage", by E. Betzig et al., *Applied Physics Letters*, vol. 61(2), 13 Jul. 1992, pp. 142–144.

"Fiber Laser Probe for Near-field Scanning Optical Microscopy", by E. Betzig et al., *Applied Physics Letters*, vol. 63(26), 27 Dec. 1993, pp. 3550–3552.

"Optical Recording", by A. B. Marchant, Addison-Wesley Publishing Company, 1990.

"GaAs Free-standing Quantum-size Wires", by K. Hiruma et al., *Journal of Applied Physics*, vol. 74(5), 1 Sep. 1993, pp. 3162–3171.

"Growth and Characterization of Nanometer-Scale GaAs, AlGaAS and GaAs/InAs Wires", by K. Hiruma et al., *IEICE Transactions on Electronics*, vol. E77–C, No. 9, Sep. 1994, pp. 1420–1425.

*Primary Examiner*—Georgia Y. Epps
*Assistant Examiner*—Kim-Kwok Chu
*Attorney, Agent, or Firm*—Eugen E. Pacher

[57] ABSTRACT

Near-field optical apparatus according to the invention contains a novel semiconductor laser photon source. The source is capable of providing substantially higher photon flux than prior art near field sources, potentially facilitating read-out rates in the megahertz range in exemplary near-field data storage and retrieval apparatus. The novel source comprises a non-uniform laser emission face, with the emission face configured such that at least 50% of the total radiation emission is from a small (first) region of the emission face, of width less than $\lambda_s/2$, where $\lambda_s$ is the emission wavelength of the laser. In an exemplary embodiment, a multilayer coating is provided on the emission face, such that radiation emission from the face is relatively low. A recess is formed in the coating such that substantial radiation emission from the recess occurs. The recess constitutes the first region. Exemplarily, the coating comprises at least one dielectric layer, with at least one conductor layer thereon. The recess extends through the conductor layer, and exemplarily is formed by FIB (focussed ion beam) etching. A variety of other embodiments are also disclosed, as are other applications of lasers according to the invention.

13 Claims, 6 Drawing Sheets

NEAR-FIELD OPTICAL APPARATUS WITH A LASER HAVING A NON-UNIFORM EMISSION FACE

FIELD OF THE INVENTION

This invention pertains to near-field optical apparatus comprising a semiconductor laser radiation source. Exemplarily the apparatus is optical storage apparatus, or a near-field scanning optical microscope, or a near-field lithography source.

BACKGROUND OF THE INVENTION

Near-field optical apparatus is known. See, for instance, D. W. Pohl et al., *Applied Physics Letters*, Vol. 44(7), p. 651; and U. Durig et al., *J. Applied Physics*, Vol. 59(10), p. 3318, both incorporated herein by reference. As is well known, critical requirements of near-field optics are radiation source (or aperture) dimensions much less than the wavelength ($\lambda_s$) of the radiation in air, and a distance between source (or aperture) and object that also is much less than $\lambda_s$.

The potential of near-field optics for high density data storage has been recognized. See, for instance, E. Betzig et al., *Applied Physics Letters*, Vol. 61(2), p. 142, which reports the use of near-field scanning optical microscopy to record and image magnetic domains in thin-film magneto-optic materials. Radiation from an $Ar^+$ laser was coupled into an optical fiber with tapered and metallized probe end. The apparatus facilitated writing of domains of sizes down to about 60 nm, and in the imaging mode attained resolution of 30–50 nm. Data densities of about 7 Gbits/cm$^2$ were reported. Such high data densities would be highly desirable, if the data could be read out at sufficiently high rates.

A shortcoming of prior art embodiments of near-field imaging is the relatively low attained read-out rate. For instance, the above-cited reference reports a maximum read-out rate of about 10 kHz, limited primarily by shot noise. In view of the rate limitation by shot noise, it is evident that provision of higher photon flux could facilitate higher read-out rates.

E. Betzig et al., *Applied Physics Letters*, Vol. 63(26), p. 3550, report a near-field imaging experiment that utilized a $Nd^{3+}$ doped fiber laser probe with tapered probe end. Operating this fiber laser near its threshold, large modulations in the radiation from the other end of the fiber were observed. However, relaxation oscillations limited the read-out rate to several tens of kHz, and the output of the probe end was only about 50 nW, not sufficient for recording at high data rates.

In view of the potential advantages of near-field optical apparatus, e.g., optical data storage with near-field read and/or write means, it would be highly desirable to have available a readily manufacturable photon source of lateral dimensions much less than $\lambda_s$ that can provide a stable photon flux sufficiently high to permit read-out and/or recording at rates above those achieved by the prior art. This application discloses such a photon source. A. B. Marchant, "Optical Recording", Addison-Wesley 1990, provides background information on optical recording and is incorporated herein by reference.

Figure 1:
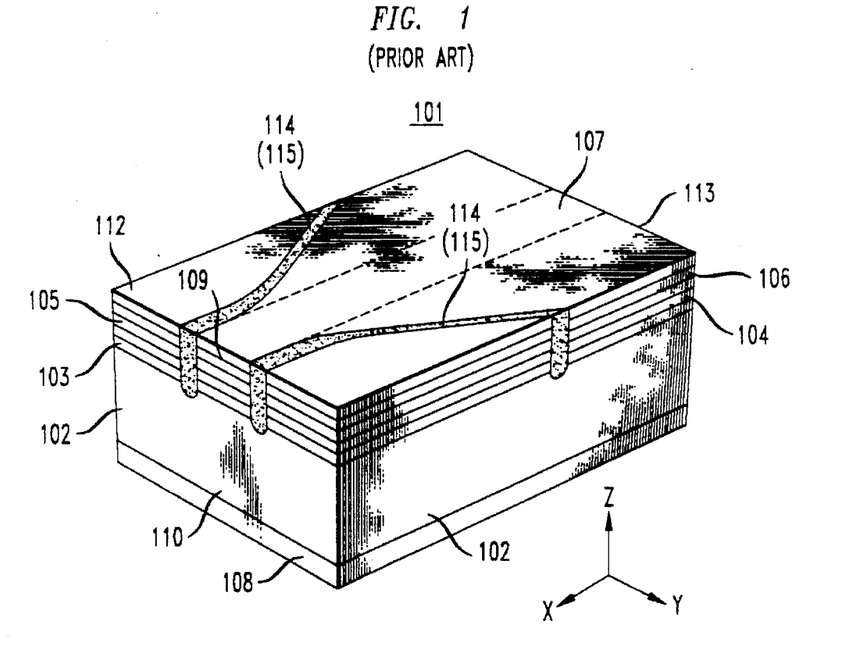
FIG. 1 shows a prior art laser.

U.S. Pat. No. 4,860,276 (also incorporated herein by reference) discloses an optical read/write head that utilizes a self-coupled semiconductor laser located close to the surface of the recording medium. Among the disclosed features is provision of an antireflection coating on the laser facet that faces the recording medium, provision of a waveguide lens to focus the laser output on the recording medium, and modifications of the laser to decrease the laser spot size. In particular, the '276 patent discloses a laser 101 as shown in FIG. 1 herein, wherein numerals 102–107 refer, respectively, to substrate, lower clad layer, active layer, upper clad layer, insulation layer and current concentration electrode. Numeral 108 refers to the bottom electrode, and 109 to a cap layer. Numerals 110 and 113 refer, respectively, to the front and rear output end, and 112 refers to a further electrode. Numeral 114 refers to slits for sharpening the beam spot. The slits define a tapered laser region, and extend to substrate 102. They are produced by, e.g., reactive ion etching. Preferably the slits are filled with a filler 115 having lower refractive index than active layer 104. FIGS. 14, 17 and 18 of the '276 patent show modifications of the above-described prior art laser. The modifications also involve slits 114 and filler 115, but have a shaped current concentration electrode 107.

The '276 patent also discloses a monolithic multi-device assembly that comprises an erasing head, a write head and a read head, with longitudinal slits, and with the output end of the erase head being recessed. The '276 patent further discloses (e.g., at col. 9, line 17) that the optical spot size is about 1 µm in diameter, and still further discloses (e.g., col. 8, line 7) an exemplary distance of 2.9 µm between laser front facet and recording medium. The optical head of the '276 patent thus apparently is, strictly speaking, not a near-field device, since the disclosed dimensions are not substantially less than the laser wavelength (exemplarily 830 nm in air; see, for instance, col. 7, line 49).

Lasers with slits as disclosed in the '276 patent are difficult to manufacture, as it is difficult to closely control the lateral spacing between the slits 114 at and near the front facet of the laser; furthermore, it is difficult to reliably manufacture lasers of the prior art type having a spacing between the slits substantially less than $\lambda_s$, e.g., less than about 0.4 µm, all due to the limitations of photolithography as currently practiced. A further problem in the prior art laser are the relatively high losses in the tapered region, with consequential heating of the laser.

It clearly would be desirable to have available semiconductor lasers for use in near-field optical apparatus that can be manufactured relatively simply to have spot size less than 0.4 µm. The 0.4 µm limit defines the approximate lower spot size limit attainable with photolithography as currently practiced. In preferred lasers disclosed herein, the small spot size is achieved without photolithography.

Glossary and Definitions

In "near-field" optical apparatus the lateral dimensions of the emission region are substantially less (typically at most half) of the wavelength in air $\lambda_s$ of the radiation, and the distance l between the emission region and the object (e.g., optical storage medium) is typically less than $\lambda_s$.

The "emission face" of a semiconductor laser herein is the face of the laser from which the probe beam (read and/or write beam) is emitted. If the laser is an edge-emitting laser then the emission face is the front facet of the laser, and if the laser is a vertical cavity surface emitting laser (VCSEL) then the emission face typically is the top surface parallel to the layer structure of the VCSEL. See, for instance, U.S. Pat. No. 5,034,344 for information on VCSELs. The laser face opposite the emission face will be referred to as the "back" face or facet.

When the term "conductor" herein is applied to a coating on the laser emission face, then the term is intended to include metals as well as other materials (e.g., semiconductors) that have high absorption for the radiation of wavelength $\lambda_s$.

The "effective width" of the active region or active layer of an edge-emitting laser herein is the width of the active region (measured in the y-direction; see FIG. 1) in which recombination occurs. Typically this corresponds substantially to the width of the top electrode (or other current confining feature). For instance, in the lasers of FIGS. 13(A) and 17 of the '276 patent, the effective width is the (respectively constant and non-constant) width of current concentration electrode 107. The effective width thus can be a function of the length coordinate (x) of the edge-emitting laser. In VCSELs the effective width of the active region is the lateral dimension (typically diameter) of the region in which recombination occurs.

SUMMARY OF THE INVENTION

The invention is embodied in near-field optical apparatus (e.g., optical information storage apparatus, near-field optical microscope, photolithography or photochemical apparatus) that comprises an improved semiconductor laser (edge-emitting or VCSEL) radiation source.

More specifically, the invention is embodied in apparatus that comprises a semiconductor laser that comprises an active region of effective width W and an emission face. The apparatus further comprises means (typically including electrodes) for causing flow of an electric current through the laser such that electromagnetic radiation of wavelength $\lambda_s$ is emitted from the laser at the emission face, and still further comprises control means that are adapted for moving the laser relative to a medium (e.g., an optical information storage medium, a body that is being investigated by near-field scanning optical microscopy, or a photoresist-covered substrate) having a surface, including moving the laser such that the emission face is close to, but spaced a predetermined distance l from, the surface of the medium.

Significantly, the laser comprises a non-uniform emission face configured such that at least 50% of the total radiation emission from the emission face is emission from a first region of the emission face having a width $w<\lambda_s/2$, with W at the emission face being greater than w. Optionally the emission face is provided with a protective coating, e.g., a thin $Al_2O_3$ or $SiO_2$ layer.

Exemplarily, the emission face of an edge-emitting laser comprises a coating (typically comprising a conductor layer), with a recess of width w in the coating constituting the first region of the emission face. The recess is positioned over the active layer of the laser, and more than 50% (preferably more than 90 or even 95%) of the total emission from the emission face is emission from the recess in the coating.

By way of a further example, the emission face of another edge-emitting laser comprises a recessed (or ion implanted) region or regions and a non-recessed (or non-implanted) region (the first region) of width $w<\lambda_s/2$, such that light emission is caused to occur largely from the non-recessed (or non-implanted) first region. By way of a still further example, the emission face of a VCSEL is the top surface of the laser and comprises a coating (typically comprising a conductor layer) with a recess (the first region) of lateral dimension $w<\lambda_s/2$ therein, such that light emission is largely confined to the first region.

The non-uniform emission face of preferred lasers according to the invention can be prepared without photolithography, exemplarily by focussed ion beam (FIB) etching or ion implantation. The FIB etching process is highly controllable and can readily produce features of width w<0.1 μm, even less than 0.05 μm. Use of other suitable etching techniques is however not precluded.

The remainder of the apparatus (e.g., the means for flowing a current through the laser, and the means for holding the laser and for moving the laser relative to a medium, (for instance, relative to an optical storage medium or to a microscopy specimen) can be conventional, exemplarily substantially as described in the '276 patent. See also the above-cited book by A. B. Marchant.

BRIEF DESCRIPTION OF THE DRAWINGS

The figures are not intended to show objects to scale or in proportion.

DETAILED DESCRIPTION OF SOME PREFERRED EMBODIMENTS

In a first exemplary embodiment of the invention, the emission face of an edge-emitting laser comprises a multilayer coating disposed on the semiconductor endface of a conventional semiconductor laser, e.g., a GaAs/InGaP ridge waveguide laser. Such lasers are well known to those skilled in the art. Exemplarily, the laser has an emission wavelength $\lambda_s$=0.98 μm. The coating comprises a recess that constitutes the first region of the emission face.

The multilayer coating is selected to have low transmittance (e.g., <1%) at $\lambda_s$, and may also have low reflectance (e.g., <10%) at $\lambda_s$. The choice of low transmittance and reflectance implies absorption in the coating of a major portion of the radiation that is incident on the coating. Such absorption may in some cases result in damage to the semiconductor/coating interface. Consequently, it may frequently be desirable to select a coating that has relatively high reflectance at $\lambda_s$ (e.g., >90%), or a coating having some intermediate value of reflectance (e.g., about 50%).

Those skilled in the art will appreciate that the referred-to transmittance and reflectance of the coating are the values associated with a coating of lateral extent much greater than $\lambda_s$. These transmittance and reflectance values will be referred to as "macroscopic" transmittance and reflectance.

The recess in the coating desirably is formed such that coating material remains at the bottom of the recess, the recess depth selected such that the remaining coating would have relatively high macroscopic transmittance (e.g., >10%, preferably ≥50%) at $\lambda_s$. Those skilled in the art will appreciate that the actual transmittance at the recess typically will differ from the above referred to macroscopic transmittance, due to the small lateral extent (less than $\lambda_s/2$) of the recess.

Figure 2:
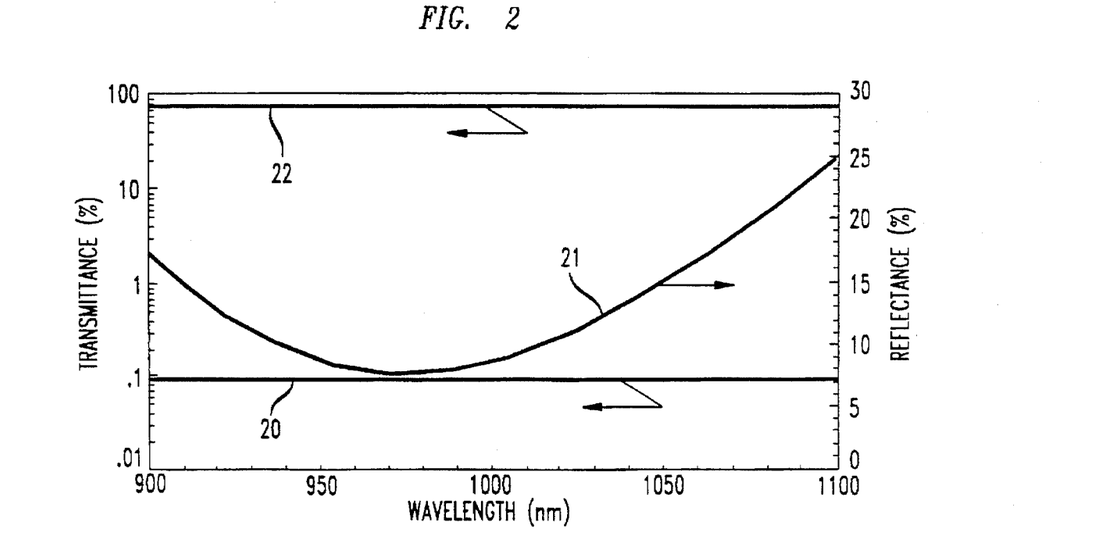
FIGS. 2–4 show curves of (macroscopic) reflectance and transmittance as a function of wavelength, for three exemplary multilayer coatings.

The above discussed properties of small macroscopic transmittance and reflectance can be attained with a coating that comprises at least one dielectric layer, and at least one conductor layer on the dielectric layer. FIG. 2 shows computed curves of macroscopic transmittance and reflectance as a function of wavelength of an exemplary $SiO_2/Ti/Au$ coating on the endface of a GaAs/InGaP laser as described above. The layer thicknesses are 312 nm, 40 nm and 70 nm, respectively. Curve 20 gives transmittance through the $SiO_2/Ti/Au$ coating from the semiconductor into air, and curve 21 gives the reflectance of the coating back into the semiconductor. Curve 22 gives the (macroscopic) transmittance through the 312 nm $SiO_2$ layer from the semiconductor into air.

FIG. 2 demonstrates that it is readily possible to select a multilayer coating that provides low transmittance and reflectance at $\lambda_s$, and that provides high macroscopic transmittance after removal of a portion of the coating. Removal of the Au and Ti layers to form the recess results in an emission face with highly localized emission, with at least 50% of the emitted radiation being emitted from the recess.

Figure 3:
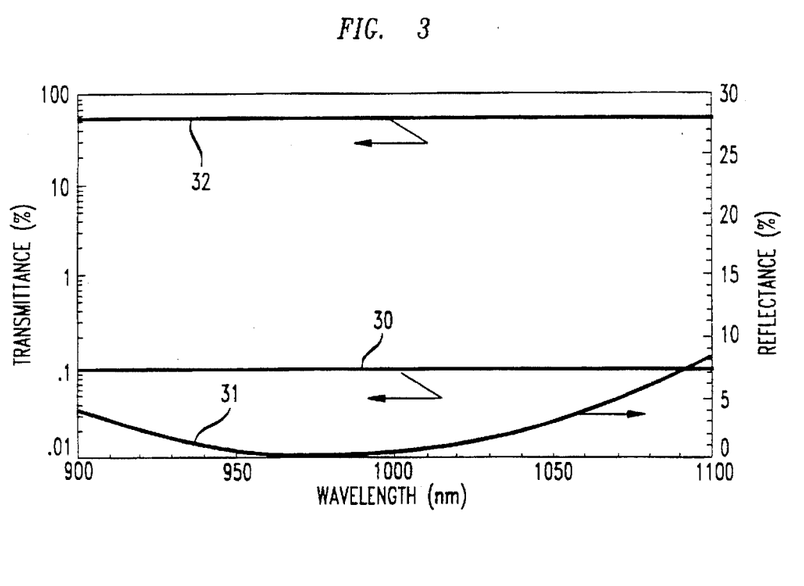

FIG. 3 shows computed macroscopic transmittance and reflectance curves for a further exemplary multilayer coating, with curves 30 and 31 pertaining to the complete coating (58 nm $TiO_2$, 143 nm $SiO_2$, 58 nm $TiO_2$, 40 nm Ti and 70 nm Au), and curve 32 referring to the dielectric portion of the coating, without the conductor layers thereon. As can be readily seen, reflectance and transmittance at $\lambda_s$ of the complete coating are low (both <10%), and the transmittance through the $TiO_2/SiO_2/TiO_2$ portion is about 50%.

Figure 4:
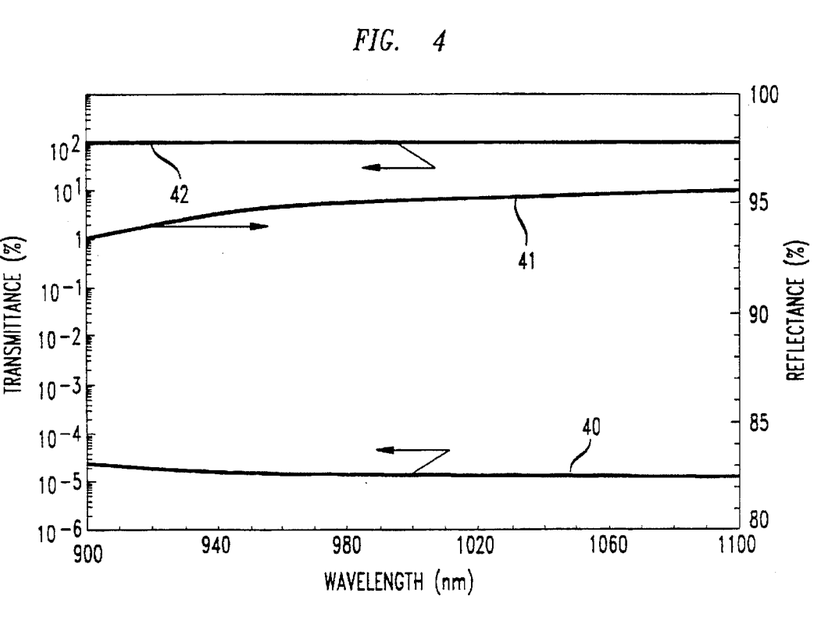

FIG. 4 shows macroscopic transmittance and reflectance of a still further exemplary coating (153 nm $SiO_2$, 80 nm Al) useful in the practice of the invention. Curves 40 and 41 are, respectively, the macroscopic transmittance and reflectance of the $SiO_2/Al$ coating, and curve 42 is the macroscopic transmittance through the $SiO_2$ layer. As can be seen from FIG. 4, the 2-layer coating has substantially zero transmittance and high (~95%) reflectance, whereas the $SiO_2$ layer has substantially 100% transmittance. Provisions of an optional thin (e.g., 10 nm) protective dielectric layer on the emission face generally does not substantially alter the emission from the recess.

Figure 6:
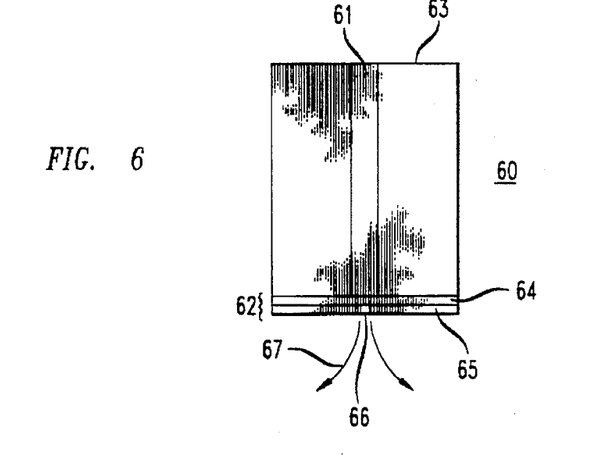
FIG. 6 shows schematically, in top view, an exemplary edge-emitting laser according to the invention.

Many dielectrics that are potentially suitable for facet coatings are known to those skilled in the art. Among them are $TiO_2$, $SiO_2$, $Al_2O_3$, phosphosilicate glass, VYCOR glass, AlN, polymers and MgF. Similarly, many conductors that are potentially useful for facet coatings are known to those skilled in the art. Among them are Ti, Au, Al, Cr, Ag and Ni. Desirably, conductors that have high attenuation at $\lambda_s$ are chosen. In addition, Ti can act as an adhesion layer for subsequent conductor layers. An exemplary embodiment comprises a phosphosilicate (6% phosphate) glass layer, with an Al layer thereon, in a configuration substantially as shown in FIG. 6.

It will be appreciated that in inventive lasers of the above-described type only a very small portion of the incident laser radiation is transmitted through the uniform coating, and that removal of a portion of the coating in a first region of the emission face results in greatly increased transmission of laser radiation from the semiconductor through the recess into air.

Formation of the multilayer coating on the endface of the edge-emitting semiconductor laser can be conventional, and can be accomplished by any appropriate known method, e.g., by e-beam or thermal evaporation, MBE, sputter deposition or CVD. Although multilayer coatings are currently preferred, coatings consisting of conductor only are also contemplated.

Figure 5:
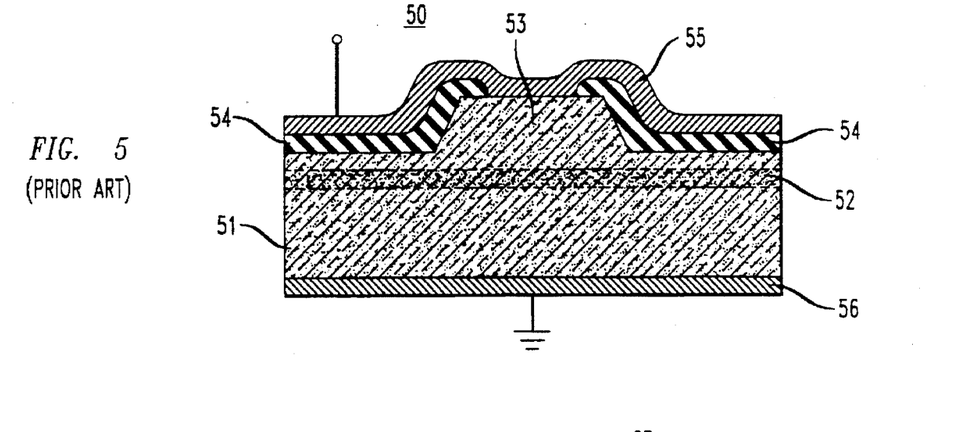
FIG. 5 schematically depicts, in front view, a conventional edge-emitting laser.

FIG. 5 schematically depicts an exemplary ridge waveguide laser 50 in front view, with numerals 51–56 referring, respectively, to the first conductivity type (e.g., n-type) portion of the semiconductor body, the active region (typically comprising one or more quantum wells), the second conductivity type (e.g., p-type) portion of the semiconductor body, the patterned dielectric layer, the upper contact and the lower contact. The width of the ridge typically is about 1–6 μm, and the height thereof typically is about 1–2 μm. The size of the emission area is roughly given by the width of the ridge in the y-direction (see FIG. 1), and is determined by the waveguide geometry in the z-direction. A typical value of emission region z-dimension for a widely used GaAs/InGaP laser is about 0.3 μm, resulting exemplarily in an emission area of approximate size 6×0.3 μm (defined by the 20% of maximum density contour). The above discussed multilayer coating can be formed on the laser endface of the laser of FIG. 5.

After coating formation, the uniform coating is modified to yield the required non-uniform emission face. Exemplarily, the conductor layer (or layers) is removed from a portion of the emission face (the first region), thereby creating a recess in the coating. Removal typically is carried out such that essentially all conductor material is removed from the first, and typically such that at least some dielectric material remains in the first region. A function of the remaining dielectric is the protection of the underlying semiconductor. Typically, material removal will be terminated at, or soon after, completion of conductor removal. Optionally, a further dielectric (e.g., $Al_2O_3$) layer can be deposited on the emission face to provide protection to the metal coating.

A currently preferred removal method is focussed ion beam (FIB) etching. This technique is known, and FIB machines are commercially available. For instance, we are using a commercially available machine (MICRION 9000 FIB System) which can, for instance, provide a $Ga^+$ beam focussed to a spot size of 20 nm. This is not a fundamental limit, and even smaller spot sizes are attainable.

Those skilled in the art will know that FIB machines not only can be used to remove material from a sample by ion beam etching, but can also provide an image of the sample. This is an advantageous feature that facilitates appropriate placement of the recess in the emission face. Typically it will be desirable to position the recess substantially in the center of the active region of the laser.

FIG. 6 schematically depicts an exemplary laser according to the invention in top view. Numerals 61–67 refer, respectively, to the ridge waveguide, the emission face (comprising the semiconductor endface and the multilayer coating thereon), the back facet (optionally coated), the dielectric portion of the emission face coating (possibly comprising a multiplicity of dielectric layers), the conductor portion of the emission face coating (possibly comprising a multiplicity of conductor layers), the recess in the emission face coating, and the radiation emitted through the recess.

The recess has maximum width less than $\lambda_o/2$, preferably 0.2 µm or less. It can have any desired shape, e.g., square, rectangular, elliptical or circular. It is positioned over the active region, typically over the region of maximum emission intensity in the uncoated laser.

By way of example, we have made a 0.98 µm ridge-waveguide laser as described above, with 0.2×0.2 µm recess in the emission face, and have obtained output powers of up to 0.6 mW at 40 mA from the recess. This power was approximately 25% of the output power from the emission face of the uncoated laser at the same current, and is about 4 orders of magnitude larger than the powers obtained from the prior art tapered optical fibers. Theoretical considerations indicate that the output powers obtained from the exemplary laser according to the invention will allow read-out or writing of the information at megahertz rates, exemplarily at rates in the range 10–100 MHz.

An exemplary technique of making lasers according to the invention of the above-discussed type involves imaging the uncoated emission face of the laser with appropriate imaging means (e.g., FIB or other particle beam apparatus), locating the active layer in the emission face and permanently marking the active layer, typically by removal of some material from the active layer at points near the outer limits of the emission region, or outside of the emission region. Material removal conveniently is by means of the particle beam of the imaging apparatus. Subsequently, the coating is deposited on the emission face, and the recess is formed, with the position of the recess determined with reference to the previously produced (and still discernible) markings.

Figure 12:
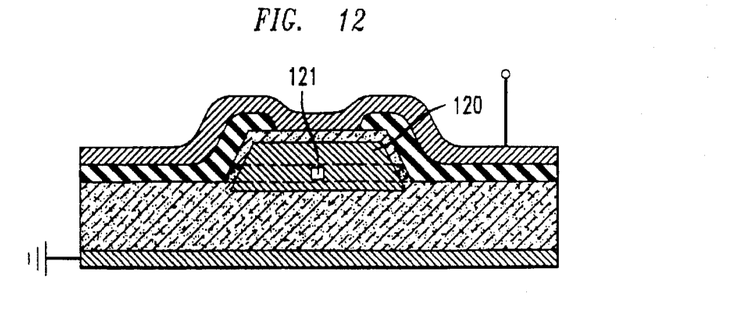
FIG. 12 schematically shows, in front view, a further exemplary laser according to the invention and FIG. 13 schematically illustrates a method of making an optical head sub-assembly for near-field apparatus according to the invention.

FIG. 12 schematically shows another exemplary laser according to the invention, substantially like the laser of FIG. 5, except that conductor layer 120 covers only a predetermined portion of the emission face, namely, substantially all of the emission spot. A selected region of the emission face can be covered with a conductor (e.g., Ti, W, Au) layer by means of conventional FIB apparatus, as those skilled in the art will know. In the thus deposited conductor material is then formed recess 121, substantially as described above. An optional protective layer may subsequently be deposited on the emission face, and an optional dielectric layer can be disposed between the semiconductor facet and the metal layer.

Although currently not preferred, it may be possible to produce a recess of the requisite small size by a process that involves photolithography, provided the photoresist thickness is less than the smallest lateral dimension of the recess. More specifically, on the appropriately coated emission face of the laser is deposited a layer of e-beam photoresist (e.g., PMMA) of thickness not more than the smallest lateral dimension of the feature to be formed. The emission face is imaged in a conventional scanning electron microscope, and the photoresist directly above the intended recess site is exposed in conventional manner by e-beam bombardment. After conventionally developing the photoresist, the emission face is etched with a conventional metal etchant such that the recess is formed by removal of the predetermined portion the metal layer or layers.

Figure 7:
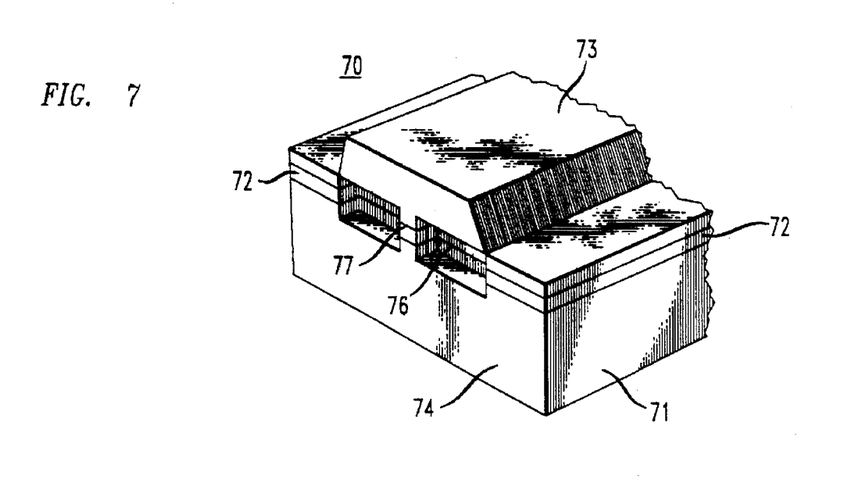
FIG. 7 schematically shows a further exemplary edge-emitting laser according to the invention.

In a further embodiment, the emission face of the laser (70) is non-planar, as schematically shown in FIG. 7. Numerals 71–73 refer, respectively, to the first conductivity type portion of the semiconductor body, the active layer, and the ridge waveguide. Numeral 74 refers to the emission face of the laser, and numerals 76 refer to recessed portions of the emission face, with unmodified portion 77 of the facet therebetween. Conventional features such as insulator layer and electrodes are not shown.

Recessed portions 76 extend below the active layer, and are typically recessed from the original facet by an amount in the appropriate range 20–200 nm. Recesses 76 are advantageously formed by FIB etching, with the width of unrecessed portion 77 being $<\lambda_o/2$.

It will be appreciated that the unrecessed portion 77 of this embodiment is the first region of the emission face. It will also be appreciated that the emission face could be modified such that first region 77 is not only bounded by recessed portions 76 in the y-direction but also in one or both z-directions.

By way of example, we formed, by FIB etching of the emission face of a conventional GaAs/InGaP 0.98 µm laser, a 0.3 µm wide and 0.4 µm high first region, with the surrounding portion of the endface being recessed by about 0.1 µm. We observed substantial confinement of the output radiation to the first region. The output power was about 0.1 mW, about 10% of the total output from the emission lace before FIB etching thereof.

The reason for the observed substantial confinement is not fully understood at present. Therefore it is not yet possible to precisely define the relevant design parameters, including the optimal amount of recess. We expect that recesses in the range 0.02–0.2 µm will result in substantial beam confinement, but recesses outside this range may also produce use fill confinement. Building on our teachings, it will be a simple matter for those skilled in the art to experimentally determine an appropriate recess depth for a given laser.

The desired non-uniformity of the emission face can also be created by neans of ion bombardment (eg., 30 KeV Ga ions) of the emission face, with the first region being an appropriately positioned unbombarded region of the emission face.

Figure 8:
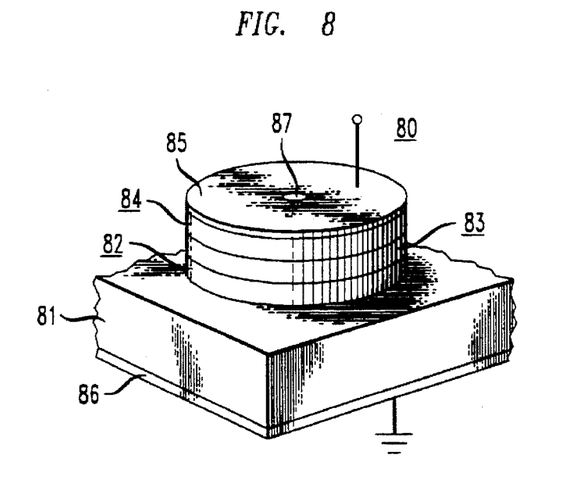
FIG. 8 schematically depicts a VCSEL according to the invention.

The above discussion pertains substantially to edge-emitting lasers according to the invention. However, the invention is not limited to edge-emitting lasers, and use of VCSELs is also contemplated. A VCSEL according to the invention will have an appropriately dimensioned recess (e.g., diameter $<\lambda_o/2$ in its emission face, as is schematically shown in FIG. 8, wherein numerals 81–87 refer, respectively, to the substrate, the lower multilayer mirror, the active region, the upper multilayer mirror, the upper contact, the lower contact, and the recess through the upper contact.

Figure 9:
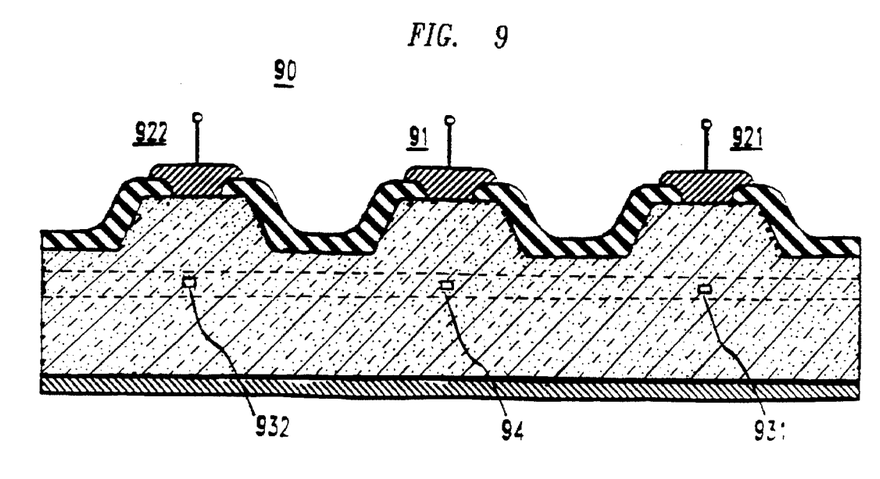
FIG. 9 schematically shows, in front view, a three-laser array according to the invention.

Lasers according to the invention can be provided in a variety of configurations, including a single laser monolithically integrated with a photodetector (see, for instance, FIG. 4(B) of the '276 patent), multiple lasers (not necessarily all lasers according to the invention) monolithically integrated on a common semiconductor substrate (see, for instance, FIG. 19 of the '276 patent), and multiple monolithically integrated lasers, at least one of which is monolithically integrated with a photodetector (see, for instance, FIG. 21 of '276). Among multiple monolithically integrated lasers can be one or more "erase" lasers, one or more "write" lasers, one or more "read" lasers, and/or one or more "tracking" lasers. FIG. 9 schematically depicts in front view an exemplary array of 3 monolithically integrated lasers 90, with the middle laser (91) being a read/write laser, and the two outside lasers (921, 922) being tracking lasers. The read/write laser is a laser according to the invention, and the tracking lasers typically will also be lasers according to the invention. The recesses (931, 932) of the respective tracking lasers can be offset vertically in opposite z-directions with respect to the recess (94) of the read/write laser, thereby facilitating monitoring and correcting the position of the read/write beam with respect to the data track. Such facilitation can however also be obtained by providing a laser array without z-direction offset of the recesses, if the array is mounted on the "slider" at an appropriate angle. For representations of a slider and a laser mounted thereto, see, for instance, FIGS. 4(A) and 4(D) of the '276 patent.

As is well known, aerodynamic design can be used to cause the slider with attached laser or laser array to "fly" over, and close to, the surface of a spinning medium, e.g., an optical storage medium in disk form. For background on optical data storage, see, for instance, the above cited book by A. B. Marchant.

Figure 10:
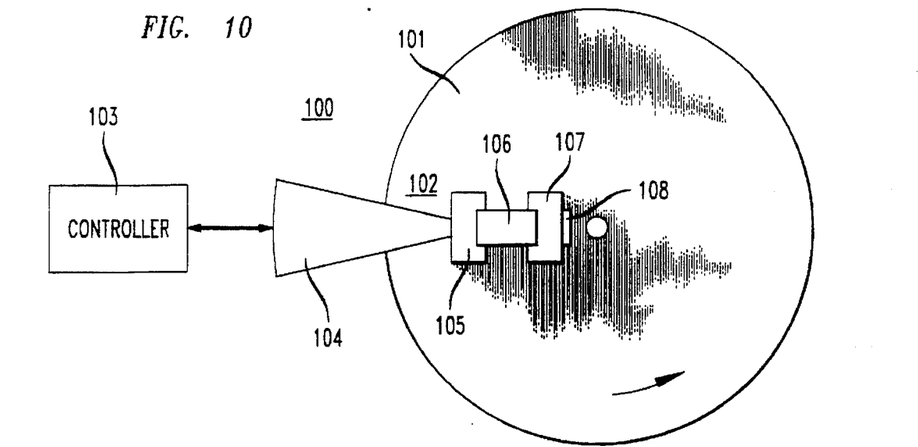
FIG. 10 schematically depicts apparatus according to the invention comprising a piezoelectric control element.

Conventionally, the slider is mechanically connected to the remainder of the apparatus by means that comprise a spring member that provides a restoring force directed towards the spinning medium. A shortcoming of many conventional arrangements is the need of providing means for preventing unwanted mechanical contact between the slider and the medium during shut-down, i.e., of providing for a "soft landing" of the slider. This shortcoming is addressed herein by apparatus that comprises a piezoelectric body (e.g., a bimorph) that, for instance, mechanically connects the slider and the radiation source, as schematically depicted in FIG. 10, wherein numeral 100 refers to optical data storage apparatus according to the invention and 101 refers to an appropriate storage medium, e.g., a magneto-optic disk or a disk with phase-change material. Exemplarily, the storage medium comprises a multiplicity of layers on a substrate body (e.g., in sequence, a $ZnS$—$SiO_2$ undercoat, Al reflector, $ZnS$—$SiO_2$ spacer, GeTeSb active layer, and $ZnS$—$SiO_2$ overcoat). Numeral 102 refers to the read (possibly read/write) arm, and 103 to the control and signal processing apparatus. The latter can be conventional. Arm 102 comprises spring member 104, to which is mechanically attached conventional slider 105, e.g., an appropriately shaped SiC or $TiC/Al_2O_3$ body. Numeral 108 refers to a laser according to the invention, with the emission face of the laser pointed towards medium 101. The laser assembly is attached to heat sink 107, e.g., a silicon chip or BeO plate or, and piezoelectric element 106 connects the laser/heatsink subassembly to the slider. As those skilled in the art will appreciate, electrical contact has to be made to both n- and p-side of the laser, as well as to the piezoelectric element. This is conventional and is not shown in FIG. 10. The laser may be integrated with a photodetector on a common substrate in known manner.

As is well known, application of an appropriate voltage across a piezoelectric element can result in a shape change of the element, e.g., can result in raising of the laser away from the surface of the medium, so as to prevent damage to laser and medium. Furthermore, the presence of a piezoelectric element makes possible active control of the fly-height of the emission face above the surface of the spinning medium. Elements suitable for use as described are commercially available, and those skilled in the art are familiar with control circuitry to accomplish the desired function of the element. Means for applying a voltage across the element can be conventional. Among piezoelectric elements useful in the practice of the invention are bimorphs and elements that operate in shear geometry.

We have developed an advantageous method of making the optical head sub-assembly that does not require active alignment, commonly used in the art. The novel method is particularly usefully applied in embodiments of the invention that comprise a laser directly attached to the slider (i.e., without interposed piezoelectric element), but could also be adapted to embodiments with interposed piezoelectric element. The method comprises providing an appropriately metallized conventional slider, placing the slider, grooved surface down, on an optical flat, providing an appropriate quantity of conductive adhesive means (e.g., conductive epoxy, solder), and urging the laser (e.g., a GaAs chip with monolithically integrated laser and photodetector thereon) towards both the slider and the optical flat, such that the emission face of the laser is in contact with the optical flat, and such that the laser is also in contact with the side surface of the slider, with adhesive means between laser and slider. This procedure is desirably carried out with micropositioners under an optical microscope. After solidification of the adhesive means, the emission face of the laser typically is essentially flush with the slider bottom surface. We have used the process to produce, with high yield, assemblies wherein the laser emission face is within $\pm\lambda/4$ of the slider reference surface.

Figure 13:
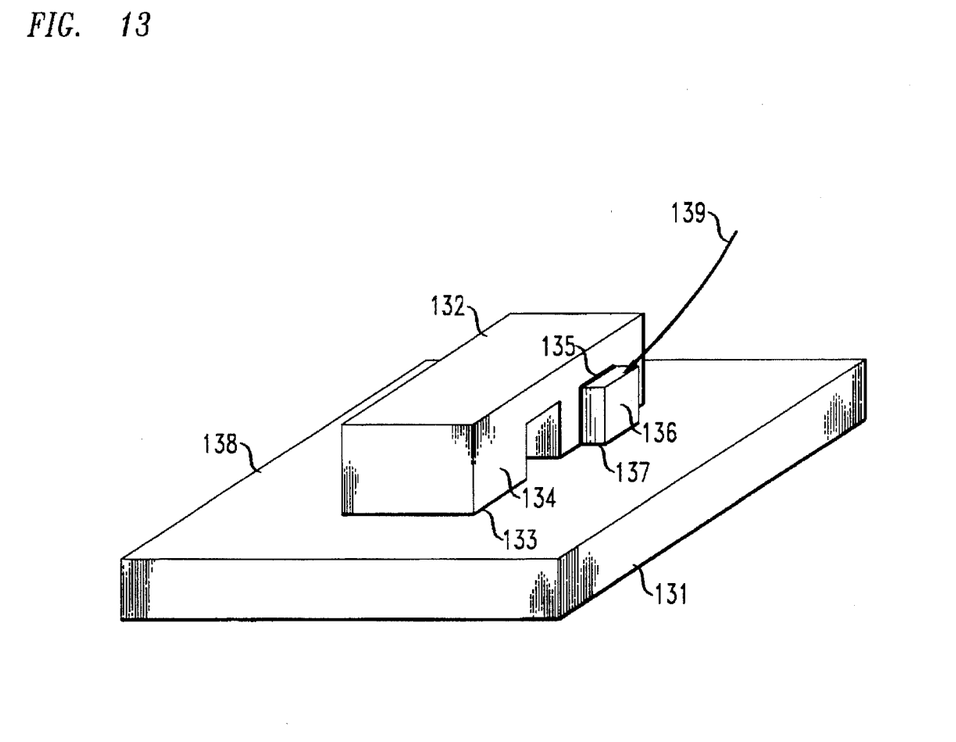

The above described method is schematically illustrated in FIG. 13, wherein numerals 131, 132 and 136 refer to the optical flat, slider and semiconductor laser, respectively. The optically flat surface of the optical flat is identified by numeral 138, and the reference surface of the slider is identified by numeral 133. The reference surface is in contact with the optically flat surface. Numeral 134 refers to the further surface of the slider, (which is at 90° with the reference surface) and 135 refers to the conductive adhesive means. A force (indicated by arrow 139) is applied to the semiconductor laser to urge laser 136 towards slider 132 and towards optically flat surface 138, such that emission surface 137 of the laser is in contact with surface 138. Exemplarily, we have achieved alignment accuracy better than 0.1 μm with the described method.

Apparatus according to the invention can be designed to carry out the read-function either in a reflective or a transmissive mode. In the former, radiation is reflected from the medium through the first region back into the laser, with the laser output depending on the reflection properties of the medium. Thus, variations in the reflection properties of the medium result in variations in some laser parameters (e.g., laser output, laser current and/or voltage across the laser). Exemplary, the variations in the radiation reflected back into the laser result in corresponding variations in the intensity of radiation from the back facet of the laser, which can be detected in conventional fashion by means of a photodetector. The photodetector can be integrated with the laser, or can be a discrete component. For more information on this mode of operation see, for instance, the '276 patent. See also U.S. Pat. Nos. 4,449,204 and 4,460,977.

Figure 11:
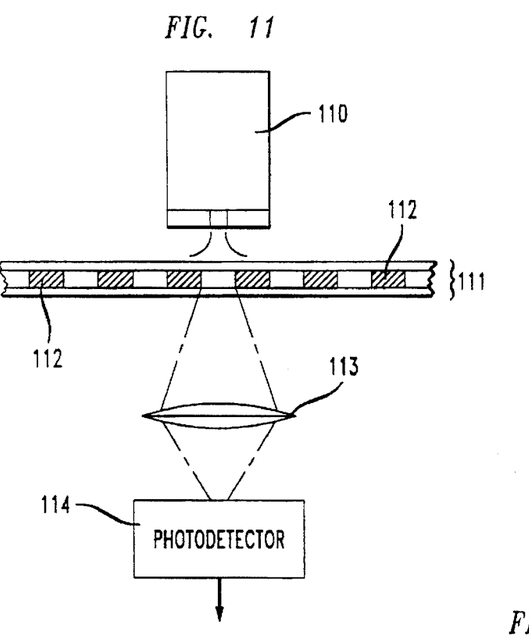
FIG. 11 schematically illustrates apparatus according to the invention adapted for use in the transmission mode.

FIG. 11 schematically depicts apparatus according to the invention that operates in the transmissive mode, wherein numerals 110–114 refer, respectively, to a laser according to the invention, the optical storage medium exemplarily comprising an active layer between two transparent protective layers, variations in the active layer that represent stored information, a conventional lens (or lens system), and a conventional photodetector.

The storage medium can in general be any medium that has properties (e.g., reflectivity, transmissivity, polarization shift, phase) that can be changed by means of an optical beam ("write" beam) directed at the medium. Exemplary of possible media are magneto-optic, phase-change, dye polymer, ablative or photoresist media. In microscopy applications the medium can be any medium capable of exhibiting appropriate spatial variations of physical properties, such that the properties of reflected or transmitted radiation are a function of position on the medium. Exemplarily the medium is a magneto-optic film or a semiconductor or biological specimen.

The invention can also be embodied in a laser having an appropriate protrusion (the protrusion to be referred to as a "wire") on the emission face. Such wires are disclosed for instance, in K. Hiruma et al., *Journal of Applied Physics*, Vol. 74(5), p. 3162, and K. Hiruma et al., *IEICE Transactions on Electronics*, Vol. E77-C, No. 9, p. 1420, both incorporated herein by reference. An appropriate wire on the emission face of a GaAs-based laser is advantageously formed by a process that comprises forming a dot of an appropriate material (e.g., Au) at the appropriate location (typically in the center of the emission region) on the emission face by FIB deposition, followed by semiconductor growth as described in the cited publications. The deposited dot has diameter less than $\lambda_s/2$, typically less than about 0.2 µm, and will be removed after wire formation. Controlled formation of such a dot would be a difficult task by prior art techniques but can be readily accomplished by FIB deposition according to our technique. Wires as described can serve to localize radiation emission from the emission face of a laser to a region of diameter less than $\lambda_s/2$, and thus can be useful in the practice of the invention. The region of the laser emission face that is covered by the wire thus constitutes the first region of the emission face. A typical length of the wire is $\lambda_s/2n$ or greater, where n is the refractive index of the wire.

The invention claimed is:

1. Near-field optical apparatus comprising
   a) a semiconductor laser comprising an active region of effective width W and having an emission face;
   b) means for causing flow of an electric current through the laser such that electromagnetic radiation of wavelength $\lambda_s$ is emitted from the active region of the laser at the emission face; and
   c) control means adapted for moving the laser relative to a medium having a surface and for irradiating said surface, including moving the laser such that the emission face is close to, but spaced a predetermined distance l from, the surface;
   CHARACTERIZED IN THAT
   d) the emission face is a non-uniform emission face selected such that at least 50% of the total radiation emission from the emission face is emitted from a first region of the emission face, said face having a width $w<\lambda_s/2$, with W>w, and l is less than $\lambda_s$.

2. Apparatus according to claim 1, wherein the laser is an edge-emitting laser having a length, and the active region is of essentially constant effective width throughout the length of the laser.

3. Apparatus according to claim 1, wherein the laser is a vertical cavity surface emitting laser.

4. Apparatus according to claim 1, wherein said emission face comprises a coating selected to have relatively low transmittance for the radiation of wavelength $\lambda_s$ from the active region in a second region of the emission face, with a recess in said coating defining said first region of the emission face.

5. Apparatus according to claim 4, wherein said coating is a multilayer coating comprising at least one dielectric layer and at least one conductive layer.

6. Apparatus according to claim 1, wherein said emission face comprises a second region that is recessed with respect to the first region and that includes a portion of the active region.

7. Apparatus according to claim 1, wherein said emission face comprises a second region that has been subjected to ion bombardment adapted for reducing radiation emission from said second region.

8. Apparatus according to claim 1, wherein said semiconductor laser is monolithically integrated with one or more further lasers.

9. Apparatus according to claim 1, wherein said semiconductor laser is monolithically integrated with a semiconductor photodetector, the photodetector disposed to receive radiation from a back facet of said semiconductor laser.

10. Apparatus according to claim 1, wherein the apparatus is optical data storage apparatus that comprises a read arm comprising a spring member and a slider attached to the spring member, said semiconductor laser being supported by said slider.

11. Apparatus according to claim 10, wherein said semiconductor laser is supported by said slider by means that comprise a piezoelectric member adapted for controllably moving said semiconductor laser with respect to the surface of the medium.

12. Apparatus according to claim 10, wherein the slider has a reference surface facing the medium, and the semiconductor laser is attached to a further surface of the slider such that the laser emission face is positioned within $\pm\lambda_s/4$ of the slider reference surface in a direction normal to the medium.

13. Method of making near-field optical apparatus, the method comprising
   a) providing a slider having a reference surface and a further surface substantially at 90° to the reference surface, with a quantity of conductive adhesive means disposed on said further surface;
   b) providing a semiconductor laser having an emission face;
   c) providing a body having an essentially optically flat surface;
   d) placing said slider onto said optically flat surface such that said reference surface is in contact with the optically flat surface;
   e) placing the semiconductor laser onto said optically flat surface such that the emission face is in contact with the optically flat surface;
   f) urging the laser towards the further surface and towards the optically flat surface, with at least some of the conductive adhesive means disposed between the semiconductor laser and the further surface; and
   g) causing the conductive adhesive to solidify such that the semiconductor laser adheres to the further surface of the slider.

* * * * *